(12) United States Patent
Suzuka et al.

(10) Patent No.: US 9,236,576 B2
(45) Date of Patent: Jan. 12, 2016

(54) PHOTOELECTRIC ELEMENT, PROCESS FOR PRODUCING PHOTOELECTRIC ELEMENT, AND PHOTOSENSITIZER

(75) Inventors: Michio Suzuka, Osaka (JP); Takashi Sekiguchi, Osaka (JP); Takeyuki Yamaki, Nara (JP); Hiroyuki Nishide, Tokyo (JP); Kenichi Oyaizu, Tokyo (JP); Fumiaki Kato, Tokyo (JP); Naoki Sano, Tokyo (JP)

(73) Assignees: Panasonic Corporation, Osaka (JP); Waseda University, Tokyo (JP)

( * ) Notice: Subject to any disclaimer, the term of this patent is extended or adjusted under 35 U.S.C. 154(b) by 311 days.

(21) Appl. No.: 13/877,528

(22) PCT Filed: Nov. 1, 2011

(86) PCT No.: PCT/JP2011/075123
§ 371 (c)(1),
(2), (4) Date: Apr. 3, 2013

(87) PCT Pub. No.: WO2012/060346
PCT Pub. Date: May 10, 2012

(65) Prior Publication Data
US 2013/0199614 A1  Aug. 8, 2013

(30) Foreign Application Priority Data

Nov. 1, 2010  (JP) ................... 2010-245382
Mar. 10, 2011  (JP) ................... 2011-053585

(51) Int. Cl.
*H01L 31/18* (2006.01)
*H01L 31/0256* (2006.01)
(Continued)

(52) U.S. Cl.
CPC .............. *H01L 51/42* (2013.01); *H01G 9/2009* (2013.01); *H01G 9/2018* (2013.01); *H01L 31/18* (2013.01);
(Continued)

(58) Field of Classification Search
CPC .... H01L 9/2009; H01L 9/2018; H01L 9/2059

USPC ......................... 136/252, 256, 263
See application file for complete search history.

(56) References Cited

U.S. PATENT DOCUMENTS 5,232,574 A   8/1993  Saika et al.
5,536,588 A *  7/1996  Naito ................. C09K 11/06
                                                    136/263

(Continued)

FOREIGN PATENT DOCUMENTS

CN    101210024 A    7/2008
JP    H04-102831    4/1992
(Continued)

OTHER PUBLICATIONS

Search Report for corresponding Taiwanese Patent Application No. 100139730 dated Sep. 27, 2013.
(Continued)

*Primary Examiner* — Susan D Leong
(74) *Attorney, Agent, or Firm* — Renner, Otto, Boisselle & Sklar, LLP

(57) ABSTRACT

A photoelectric element 1 includes a first electrode, an electron transport layer supporting a photosensitizer, a hole transport layer, and a second electrode, and these components are stacked in the above order. The electron transport layer is formed of an organic compound produced by electrolytic polymerization of a precursor having, within one molecule thereof, two or more moieties each having a structure represented by the following structural formula (1). The photoelectric element 1 includes a gel layer composed of the organic compound and an electrolyte solution infiltrated into the organic compound.

(1)

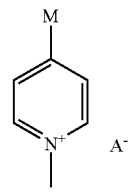

(in structural formula (1), M is a cyano group, a fluoro group, a chloro group, or a bromo group, and A⁻ is a counter-anion)

15 Claims, 1 Drawing Sheet

(51) Int. Cl.
*H01G 9/20* (2006.01)
*H01L 51/42* (2006.01)
*H01L 51/00* (2006.01)

(52) U.S. Cl.
CPC .......... *H01L 51/0006* (2013.01); *H01G 9/2031* (2013.01); *H01G 9/2059* (2013.01); *Y02E 10/542* (2013.01)

(56) References Cited

U.S. PATENT DOCUMENTS

| | | | |
|---|---|---|---|
| 7,671,219 B2 | 3/2010 | Shigemitsu et al. | |
| 2007/0202797 A1 | 8/2007 | Ishibashi | |
| 2009/0000658 A1* | 1/2009 | Zakeeruddin et al. | 136/252 |
| 2009/0188558 A1* | 7/2009 | Jen et al. | 136/256 |
| 2011/0048525 A1 | 3/2011 | Yoneya et al. | |
| 2011/0146796 A1 | 6/2011 | Sekiguchi et al. | |
| 2011/0253218 A1 | 10/2011 | Tanabe et al. | |

FOREIGN PATENT DOCUMENTS

| | | |
|---|---|---|
| JP | 08-088030 A | 4/1996 |
| JP | 2007-073933 A | 3/2007 |
| JP | 2008-156515 A | 7/2008 |
| JP | 2010-129291 A | 6/2010 |
| JP | 2010-157373 A | 7/2010 |
| WO | WO 2010/024090 A1 | 3/2010 |

OTHER PUBLICATIONS

Office Action for corresponding Taiwanese Patent Application No. 100139730 dated Oct. 3, 2013.
International Search Report for corresponding International Application No. PCT/JP2011/075123 mailed Dec. 6, 2011.
PCT/ISA/237 for corresponding International Application No. PCT/JP2011/075123 dated Dec. 6, 2011.
Peumans et al., "Very-high-efficiency double-heterostructure copper phthalocyanine/$C_{60}$ photovoltaic cells", Appl. Phys. Lett., No. 79, 2001, p. 126.
C.W. Tang, "Two-layer organic photovoltaic cell", Appl. Phys. Lett., No. 48, 1986, p. 183.
Shaheen et al., "2.5% efficient organic plastic solar cells", Appl. Phys. Lett., No. 78, 2001, p. 841.
Schon et al., "Efficient organic photovoltaic diodes based on doped pentacene", Nature (London), No. 403, 2000, p. 408.
Imahori et al., "Bunshi Taiyo Denchi No Tenbo (Prospects of Molecular Solar Cells)", Jul. 2001 issue of Kagaku Kogyo, p. 41 and English Abstract.

* cited by examiner

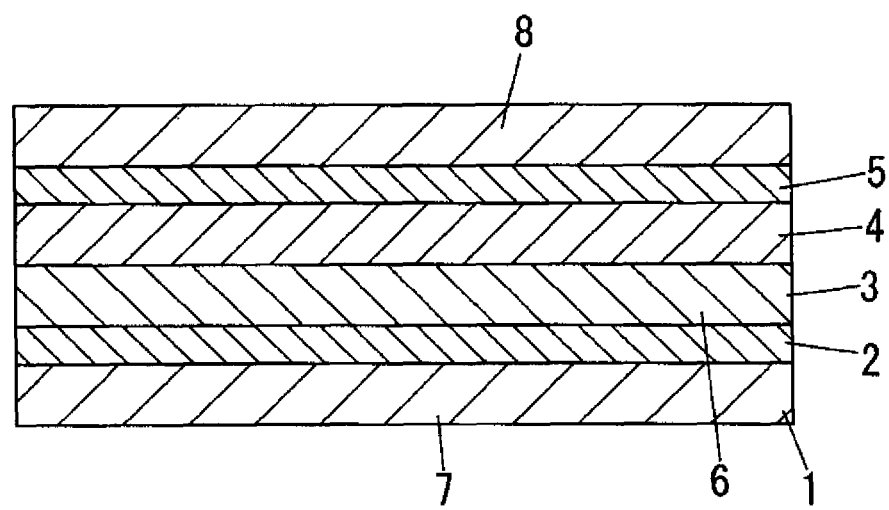

PHOTOELECTRIC ELEMENT, PROCESS FOR PRODUCING PHOTOELECTRIC ELEMENT, AND PHOTOSENSITIZER

TECHNICAL FIELD

The present invention relates to a photoelectric element that converts light into electrical energy, a process for producing the photoelectric element, and a photosensitizer used for producing the photoelectric element.

BACKGROUND ART

In recent years, an electron transport layer for transporting electrons has been becoming more important in a photoelectric element that converts light into electrical energy, such as a power generating device. The electron transport layer is required to have a high electron transport property. In addition, in the electron transport layer, it is also important that an interface at which charge separation occurs (hereinafter, referred to as reactive interface) is sufficiently wide.

Such electron transport layers have been hitherto formed of metals, organic semiconductors, inorganic semiconductors, conductive polymers, conductive carbon, and the like.

For example, an electron transport layer has been proposed which is formed of an organic substance for which electrons are carriers, such as a fullerene, a perylene derivative, a polyphenylenevinylene derivative, and pentacene. Thus, the electron transport capability of the electron transport layer has been improved, and the photoelectric conversion efficiency of the photoelectric element has been improved (see Non Patent Literature 1 for the fullerene, see Non Patent Literature 2 for the perylene derivative, see Non Patent Literature 3 for the polyphenylenevinylene derivative, and see Non Patent Literature 4 for pentacene).

In addition, it has been reported that in a molecular device-type solar cell, a structure in which an electron-donating molecule (donor) and an electron-accepting molecule (acceptor) are chemically bonded to each other is formed as a thin film on a substrate (see Non Patent Literature 5).

In the electron transport layer reported in each Non Patent Literature described above, both improvement of the electron transport performance and sufficient widening of the reactive interface are not achieved at the same time.

For example, in a photoelectric element that includes an organic-type electron transport layer formed of a fullerene or the like, recombination of charge easily occurs after charge separation. Thus, the conversion efficiency is not sufficient. In a photoelectric element that includes an inorganic-type electron transport layer formed of titanium oxide or the like, a sufficiently wide reactive interface is not formed, and an electron conductive potential which affects an open-circuit voltage is determined uniquely by the constituent elements of the electron transport layer. Thus, the conversion efficiency is not sufficient.

Furthermore, a fullerene or the like for forming an organic-type electron transport layer has poor stability as a material due to its low molecular weight, and also has relatively high solubility to a solvent. Therefore, when an electron transport layer is formed of a fullerene or the like, flexibility in device designing is decreased.

CITATION LIST

Non Patent Literature

NPL 1 P. Peumans, Appl. Phys. Lett., No. 79, 2001, page 12
NPTL 2 C. W. Tang, Appl. Phys. Lett., No. 48, 1986, page 183
NPTL 3 S. E. Shaheen, Appl. Phys. Lett., No. 78, 2001, page 841
NPTL 4 J. H. Schon, Nature (London), No. 403, 2000, page 408
NPTL 5 Hiroshi Imahori, Shunichi Fukuzumi, "Bunshi Taiyo Denchi No Tenbo (Prospects of Molecular Solar Cells)", July 2001 issue of Kagaku Kogyo, page 41

SUMMARY OF INVENTION

Technical Problem

The present invention has been made in view of the above-described circumstance, and an object of the present invention is to provide a photoelectric conversion element that includes an electron transport layer exerting an excellent electron transport property and has a sufficiently-widened reactive interface by the electron transport layer, thereby having a high photoelectric conversion efficiency, a process for producing the photoelectric element, and a photosensitizer used for producing the photoelectric element.

Solution To Problem

A photoelectric element according to the present invention includes a first electrode, an electron transport layer supporting a photosensitizer, a hole transport layer, and a second electrode, and these components are stacked in the above order. The electron transport layer is formed of an organic compound produced by electrolytic polymerization of a precursor having, within one molecule thereof, two or more moieties each having a structure represented by the following structural formula (1). The photoelectric element includes a gel layer composed of the organic compound and an electrolyte solution infiltrated into the organic compound.

[Chem. 1]

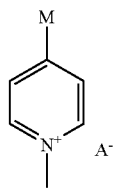

(1)

(in the structural formula (1), M is a cyano group, a fluoro group, a chloro group, or a bromo group, and $A^-$ is a counter-anion)

In the photoelectric element according to the present invention, the precursor may have, within one molecule thereof, two moieties each having the structure represented by the structural formula (1), and the organic compound may be a linear polymer.

In the photoelectric element according to the present invention, the organic compound may include at least one of a compound represented by the following structural formula (2) and a compound represented by the following structural formula (3).

[Chem. 2]

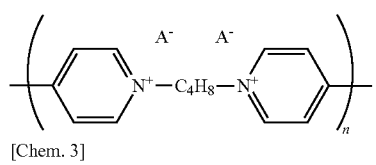
(2)

[Chem. 3]

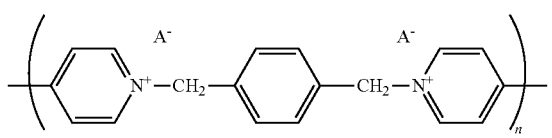
(3)

In the photoelectric element according to the present invention, the precursor may have, within one molecule thereof, three or more moieties each having the structure represented by the structural formula (1), and the organic compound may have a crosslinked structure.

In the present invention, the organic compound may include a compound represented by the following structural formula (4).

[Chem. 4]

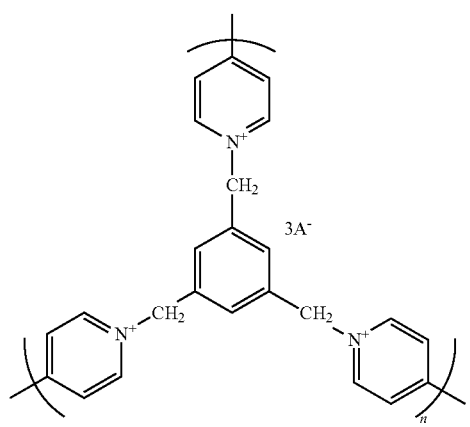
(4)

In the photoelectric element according to the present invention, the counter-anion in the precursor may be an anion selected from the group consisting of a bromine ion, a chlorine ion, a perchlorate ion, a hexafluorophosphoric acid ion, and a tetrafluoroboric acid ion.

In the photoelectric element according to the present invention, the organic compound and the photosensitizer may be chemically bonded to each other.

A process for producing a photoelectric element according to the present invention is a process for producing the photoelectric element. The process includes the step of conducting electrolytic polymerization by applying a current to the first electrode and a liquid containing the precursor in a state where the first electrode is immersed in the liquid, to deposit the organic compound on a surface of the first electrode.

In the process for producing the photoelectric element according to the present invention, the photosensitizer may be mixed in the liquid containing the precursor, and the precursor and the photosensitizer may be simultaneously electrolytically polymerized.

In the process for producing the photoelectric element according to the present invention, after the step of depositing the organic compound on the surface of the first electrode, the organic compound may be immersed in a liquid containing the photosensitizer to react the photosensitizer with the organic compound.

A photosensitizer according to the present invention is a photosensitizer for use in the process for producing the photoelectric element. The photosensitizer has at least one leaving group within one molecule thereof.

The photosensitizer according to the present invention may have a substituent represented by the following structural formula C or D.

[Chem. 5]

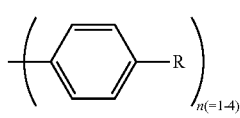
C

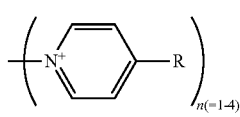
D

R in the structural formulas C and D represents a leaving group.

The photosensitizer according to the present invention may be a porphyrin derivative represented by the following general formula E, an indoline type dye having, within a molecule thereof, an indoline backbone represented by the following formula F, or a ruthenium complex type dye represented by the following general formula G.

[Chem. 6]

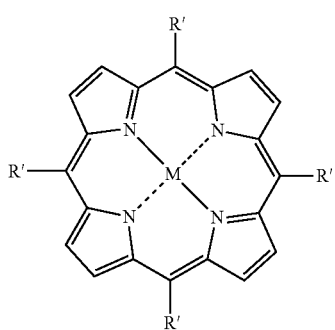
E

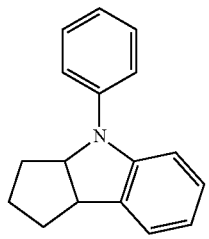
F

-continued

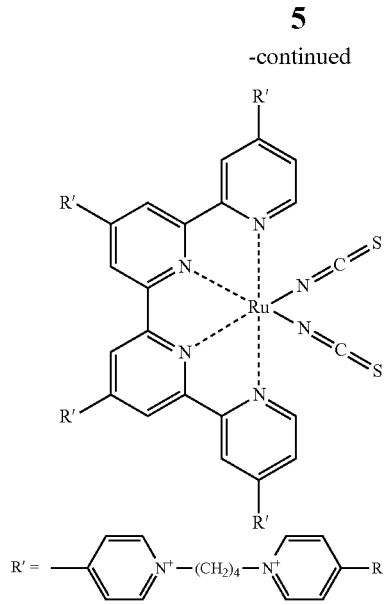

R represents a leaving group.

In the photosensitizer according to the present invention, the leaving group may be one or more groups selected from the group consisting of a cyano group, a fluoro group, a chloro group, and a bromo group.

Advantageous Effects of Invention

According to the present invention, the electron transport layer of the photoelectric element exerts an excellent electron transport property and the reactive interface by the electron transport layer is sufficiently widened. Thus, the photoelectric element has a high photoelectric conversion efficiency.

BRIEF DESCRIPTION OF DRAWINGS

FIG. 1 is a schematic cross-sectional view showing one embodiment of the present invention.

DESCRIPTION OF EMBODIMENTS

FIG. 1 shows an example of a photoelectric element 1. The photoelectric element 1 includes a first electrode 2, an electron transport layer 3, a hole transport layer 4, and a second electrode 5. The electron transport layer 3 and the hole transport layer 4 are interposed between the first electrode 2 and the second electrode 5. In other words, the first electrode 2, the electron transport layer 3, the hole transport layer 4, and the second electrode 5 are stacked in order.

The first electrode 2 is electrically connected to the electron transport layer 3. The first electrode 2 serves as a negative electrode of the photoelectric element 1 and exerts a function of extracting electrons from the electron transport layer 3 and passing the electrons to an external secondary battery or capacitor. The first electrode 2 also has a function of retaining the electron transport layer 3.

The first electrode 2 may be formed of a single film of a conductive material, or may be formed of a conductive material laminated on a first substrate 7. Preferable examples of the conductive material include metals such as platinum, gold, silver, copper, aluminum, rhodium, and indium; carbon; conductive metal oxides such as indium-tin composite oxide, tin oxide doped with antimony, and tin oxide doped with fluorine; composites of the metals and the compounds; and materials obtained by coating the metals or the compounds with silicon oxide, tin oxide, titanium oxide, zirconium oxide, aluminum oxide, and the like. In the present embodiment, an organic compound for forming the electron transport layer 3 is less likely to cause metallic corrosion as compared to halogen ion and the like, and thus the first electrode 2 may be formed of a general-purpose metal.

It is preferred that the first electrode 2 has a lower surface resistance. The surface resistance is preferably not greater than 200Ω/□ and more preferably not greater than 500Ω/□. The lower limit of the surface resistance is not particularly limited, but is generally 0.1Ω/□.

The first electrode 2 may have optical transparency. In this case, light from the outside is allowed to enter the inside of the photoelectric element 1 from the first electrode 2 side. It is preferred that the first electrode 2 is transparent to allow light to pass therethrough. In this case, for example, the first electrode 2 is formed of a transparent conductive material or the like. Alternatively, the first electrode 2 may have openings to allow light to pass therethrough. Examples of the openings formed in the first electrode 2 include slit-like openings and pore-like openings. The slit-like openings may have any shapes such as linear shapes, wavy shapes, and lattice shapes. The first electrode 2 may be formed by arranging conductive particles, and the openings may be formed among the conductive particles. When the first electrode 2 having such openings is formed, the transparent conductive material is unnecessary and thus it is possible to reduce the material cost.

It is preferred that the first electrode 2 has a higher light transmittance. The light transmittance of the first electrode 2 is preferably not less than 50% and more preferably not less than 80%.

In the case where the first electrode 2 is formed by depositing a transparent conductive oxide such as indium oxide, tin oxide, or zinc oxide on the first substrate 7, for example, a vacuum process such as a sputtering method and a vapor deposition method is used on the first substrate 7. Alternatively, a wet process such as a spin coat method, a spray method, and a screen printing method may be used.

The thickness of the first electrode 2 is preferably in a range of 1 to 100 nm. In this case, the thickness of the first electrode 2 is easily made uniform and the first electrode 2 exerts sufficient optical transparency.

The first electrode 2 may be laminated on the first substrate 7. In this case, in view of improvement of the durability of the photoelectric element 1 and the like, the first substrate 7 is formed of a structural material such as glass and plastics. The first substrate 7 exerts a function of supporting the first electrode 2.

In the case where light enters the inside of the photoelectric element 1 from the first electrode 2 side, the first substrate 7 is formed of light-transmissive glass or sheet or the like. In this case, the first substrate 7 exerts a function of introducing light from the outside to the first electrode 2, and light initially passes through the first substrate 7 and the first electrode 2 in order and enters the photoelectric element 1. In the case where light does not enter inside the photoelectric element 1 from the first electrode 2 side, the first substrate 7 may not be light-transmissive.

The second electrode 5 serves as a positive electrode of the photoelectric element 1. For example, the second electrode 5 is formed of the same material as that of the first electrode 2 by the same method as that for the first electrode 2.

In order that the second electrode 5 efficiently operates as the positive electrode of the photoelectric element 1, the second electrode 5 is preferably formed of a material having a catalysis of providing electrons to a reductant of an electrolyte in the hole transport layer 4. Examples of such materials include metals such as platinum, gold, silver, copper, aluminum, rhodium, and indium; carbon materials such as graphite, carbon nanotubes, and carbon supporting platinum; conductive metal oxides such as indium-tin composite oxide, tin oxide doped with antimony, and tin oxide doped with fluorine; and conductive polymers such as polyethylenedioxythiophene, polypyrrole, and polyaniline. Among these materials, platinum, graphite, polyethylenedioxythiophene, and the like are particularly preferred.

The second electrode 5 may be transparent. In this case, light from the outside is allowed to enter the insede of the photoelectric element 1 from the second electrode 5 side.

Furthermore, when both the first electrode 2 and the second electrode 5 are transparent, light from the outside is allowed to enter the inside of the photoelectric element 1 from both the first electrode 2 side and the second electrode 5 side. This case is effective when light is applied from the outside to both the first substrate 7 and a second substrate 8 by, for example, reflection of the light.

The second electrode 5 may be provided so as to be laminated on the second substrate 8. For example, the second substrate 8 is formed of the same material as that of the first substrate 7. When the first substrate 7 is light-transmissive, the second substrate 8 may be light-transmissive or may not be light-transmissive. However, in order to allow light to enter from both the first substrate 7 side and the second substrate 8 side, the second substrate 8 is preferably light-transmissive. When the first substrate 7 is not light-transmissive, the second substrate 8 is preferably light-transmissive.

The electron transport layer 3 is formed of an organic compound such as an organic polymer. The organic compound for forming the electron transport layer 3 swells by an electrolyte solution that stabilizes a reduction state of a redox moiety of the organic compound, whereby a gel layer 6 is formed. In the gel layer 6, the organic compound has a three-dimensional network structure, and the network space is filled with the electrolyte solution. The organic compound within the gel layer 6 aims the electron transport layer 3.

The organic compound has the redox moiety and a gel moiety within a molecule thereof. The redox moiety is a moiety that is capable of being oxidized and reduced repeatedly, namely, a moiety that becomes an oxidant and a reductant reversibly in redox reactions. The redox moiety may be composed of a moiety that forms one pair of redox systems including an oxidant and a reductant. The oxidant and the reductant of the redox moiety preferably have the same charge. The gel moiety is a moiety that swells by containing the electrolyte solution to be gel. The redox moiety is chemically bonded to the gel moiety. The positional relationship between the redox moiety and the gel moiety within the molecule of the organic compound is not particularly limited. For example, in the case where a backbone such as the main chain of the molecule is formed of the gel moiety, the redox moiety is formed as a side chain bonded to the main chain. A structure may be provided in which a molecular backbone forming the gel moiety and a molecular backbone forming the redox moiety are alternatively bonded. When the redox moiety and the gel moiety are present within the same molecule of the organic compound as described above, the redox moiety is easily retained within the gel layer 6 at a position where electrons are easily transported. The gel state of gel layer 6 is preferably a form such as a konjac jelly form or an ion exchange film form, but is not particularly limited thereto.

The degree of swelling is exemplified as a physical index affecting the size of a reactive interface formed within the gel layer 6. The degree of swelling is represented by the following equation.

Degree of swelling=(weight of gel)/(weight of dried gel)×100

The dried gel refers to a gel obtained by drying the gel layer 6. The drying of the gel layer 6 refers to removal of the solution within the gel layer 6, particularly, removal of the solvent. Examples of the method for drying the gel layer 6 include heating, removing the solution or the solvent in a vacuum environment, and removing the solution or the solvent within the gel layer 6 by using another solvent.

In removing the solvent or the solution within gel layer 6 by using another solvent, a solvent that has a high affinity to the solution or the solvent within gel layer 6 and is easily removed by heating in a vacuum environment is preferably selected for efficiently removing the solution or the solvent within the gel layer 6.

The degree of swelling of the gel layer 6 is preferably 110 to 3000% and more preferably 150 to 500%. If the degree of swelling is less than 110%, there is a concern that due to a decreasing amount of an electrolyte component within the gel layer 6, the redox moiety is not stabilized. If the degree of swelling exceeds 300%, there is a concern that due to a decreasing amount of the redox moiety within the gel layer 6, the electron transport capability is diminished. Thus, in either case, the properties of the photoelectric element 1 are deteriorated.

The organic compound having the redox moiety and the gel moiety within one molecule thereof is represented by, for example, the following general formula.

$(X_i)_n$ represents the gel moiety, and $X_i$ represents the monomer of the compound forming the gel moiety. For example, the gel moiety is formed of a polymer backbone. The polymerization degree n of the monomer is preferably in a range of n=1 to 100,000. Y represents the redox moiety bonded to $(X_i)_n$. In addition, j and k are any integers representing the numbers of $(X_i)_n$ and Y, respectively, contained in one molecule and are preferably in a range of 1 to 100,000. The redox moiety Y may be bonded to any site on the polymer backbone forming the gel moiety $(X_i)_n$.

The organic compound is obtained by electrolytic polymerization of a compound that is a precursor of the organic compound (hereinafter, referred to merely as precursor). The precursor is a compound having, within one molecule thereof, two or more moieties each having a structure represented by the following structural formula (1).

[Chem. 7]

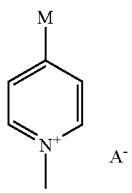

(1)

M in the structural formula (1) is an electrolytic-polymerizable functional group selected from the group consisting of a cyano group, a fluoro group, a chloro group, and a bromo group.

An example of the counter-anion $A^-$ in the structural formula (1) is an anion selected from the group consisting of a bromine ion, a chlorine ion, a perchlorate ion, a hexafluorophosphoric acid ion, and a tetrafluoroboric acid ion.

In synthesis of the organic compound by an electrolytic polymerization method, for example, the first electrode 2 and a counter electrode are immersed in a solution containing the precursor. When a voltage is applied between the first electrode 2 and the counter electrode in this state, the precursor polymerizes on the first electrode 2 by an electrochemical reaction, and the organic compound is deposited. This electrolytic polymerization method does not require advanced facility and technique as in the case of CVD, but the speed at which the organic compound is deposited is fast, and the deposited organic compound is less likely to be peeled off from the first electrode 2. Furthermore, the organic compound is easily densified and formed into a thin film. When the organic compound is densified, the redox moiety is densely arranged within the electron transport layer 3, and thus the electron transport layer 3 exerts a high electron transport property. In addition, the organic compound forming the electron transport layer 3 spreads three-dimensionally, and thus the stability of the organic compound is enhanced. Furthermore, the solubility of the organic compound to a solvent is reduced, and thus the range of choices for the solvent of the electrolyte solution is expanded.

The organic compound obtained thus has, as the redox moiety, a bipyridinium structural unit represented by the following structural formula (5). The bipyridinium structural unit is produced by electrolytic polymerization through which: the substituent represented by M is detached from the moiety of the precursor which has the structure represented by the structural formula (1); and the positions in the moieties from which the substituents represented by M are detached are bonded to each other. When the pyridinium structure unit is subjected to one-electron reduction, a pyridinium cation radical is generated. When one-electron reduction is further conducted, a pyridinium diradical is generated. On the other hand, when the pyridinium diradical is subjected to one-electron oxidation, a pyridinium cation radical is generated. When one-electron oxidation is further conducted, the structure returns to the original pyridinium structure unit. As described above, the organic compound exhibits repetitive stable redox ability. In addition, when the organic compound passes through the radical state during oxidation-reduction, a very fast self electron-exchange reaction takes place, and electrons are easily exchanged between the organic compounds. The radical state of the organic compound during oxidation-reduction is observed by, for example, ESR (electron spin resonance).

[Chem. 8]

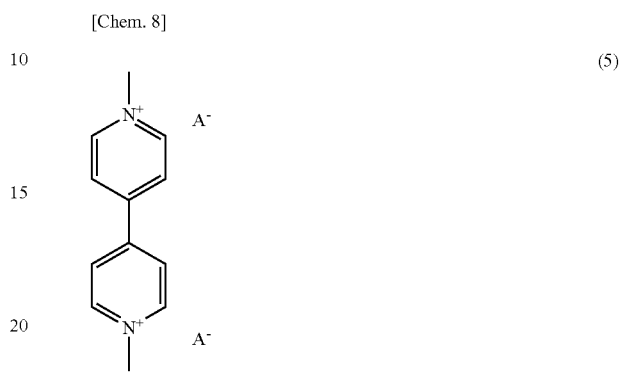

(5)

When the precursor has, within one molecule thereof, a plurality of moieties each having the structure represented by the structural formula (1), an organic compound having a high molecular weight can be produced by electrolytic polymerization of the precursor. For increasing the molecular weight of the organic compound, the precursor has, within one molecule thereof, preferably two or more moieties, and more preferably three or more moieties, each having the structure represented by the structural formula (1).

When the precursor is a compound having, within one molecule thereof, only two moieties each having the structure represented by the structural formula (1), the organic compound becomes a linear molecule. For example, when the precursor is a compound represented by the following structural formula (6), the organic compound becomes a linear molecule represented by the above structural formula (2). When the precursor is a compound represented by the following structural formula (7), the organic compound becomes a linear molecule represented by the above structural formula (3).

[Chem. 9]

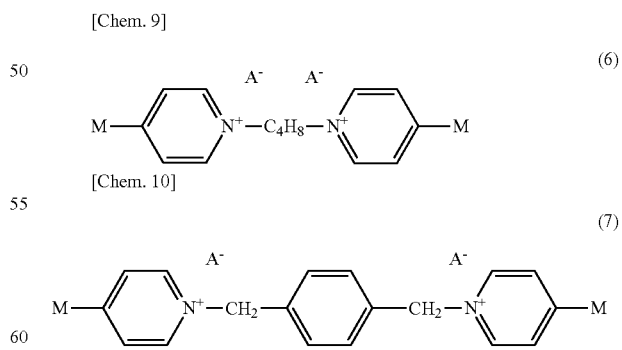

(6)

[Chem. 10]

(7)

When at least a portion of the precursor is a compound having, within one molecule thereof, three or more moieties each having the structure represented by the structural formula (1), the organic compound becomes a crosslinked polymer. For example, when the precursor is a compound represented by the following structural formula (8), the organic compound becomes a molecule represented by the above structural formula (4).

[Chem. 11]

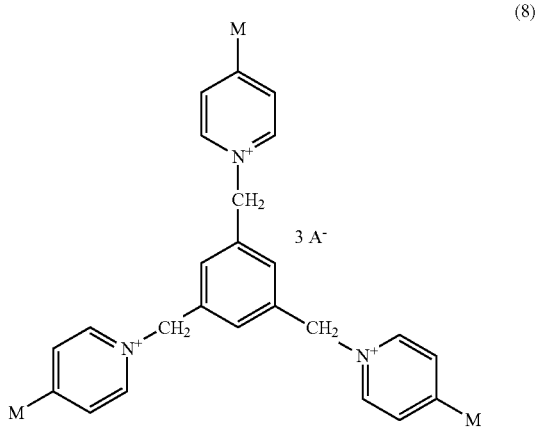

(8)

The electron transport layer 3 is formed by depositing, on the first electrode 2, the organic compound produced by the electrolytic polymerization of the precursor. In forming the electron transport layer 3, for example, the first electrode 2 is initially immersed in a solution containing the precursor. In this state, the precursor polymerizes on the first electrode 2 by electrolytic polymerization, and the organic compound is produced, whereby the electron transport layer 3 is formed on the first electrode 2. The electrode potential of the first electrode 2 during the electrolytic polymerization is set so as to be lower than the reduction potential of the precursor. By so doing, electrons are allowed to transfer within the organic compound, on the first electrode 2, which has the properties of an n-type semiconductor, and the electrolytic polymerization proceeds.

Since the organic compound produced by the electrolytic polymerization has a high molecular weight, the electron transport layer 3 formed by the electrolytic polymerization of the precursor exerts high durability. In addition, since the electron transport layer 3 is formed through the electrolytic polymerization, the electron transport layer 3 is densely formed. Thus, the density of the redox moiety within the electron transport layer 3 is increased, electrons are smoothly exchanged between the redox moieties, and the electron transport property of the electron transport layer 3 is enhanced.

The thickness of the electron transport layer 3 is preferably in a range of 0.01 to 100 μm. This is because, when the thickness is in this range, a sufficient photoelectric conversion effect is obtained, and transparency with respect to visible light and infrared light is not deteriorated. The thickness of the electron transport layer 3 is more preferably in a range of 0.5 to 50 μm and further preferably in a range of 1 to 20 μm.

The electron transport layer 3 supports a photosensitizer. Thus, a reactive interface is formed between the electron transport layer 3 and the photosensitizer, and the photoelectric conversion efficiency is improved.

A publicly known material is used as the photosensitizer. The photosensitizer may be an inorganic material such as a semiconductor ultrafine particle, or may be an organic material such as a dye and a pigment. In order that the photosensitizer efficiently absorbs light to cause charge separation, the photosensitizer is preferably a dye (sensitizing dye).

Examples of the dye include 9-phenylxanthene type dyes, coumarin type dyes, acridine type dyes, triphenylmethane type dyes, tetraphenylmethane type dyes, quinone type dyes, azo type dyes, indigo type dyes, cyanine type dyes, merocyanine type dyes, and xanthene type dyes; a ruthenium-cis-diaqua-bipyridyl complex of a $RuL_2(H_2O)_2$ type (L represents 4,4'-dicarboxyl-2,2'-bipyridine); and transition metal complexes such as ruthenium-tris ($RuL_3$), ruthenium-bis ($RuL_2$), osmium-tris ($OsL_3$), and osmium-bis($OsL_2$); zinc-tetra(4-carboxyphenyl)porphyrin; an iron-hexacyanide complex; and phthalocyanine. In addition, the sensitizer dye disclosed in the chapter of DSSC in "FPD, DSSC, Hikari Memori To Kinousei Shikiso No Saishin Gijutsu To Zairyou Kaihatsu (Latest Technology and Material Development of FPD, DSSC, Photo-memory, and Functional Dye)" (NTS Inc.) may also be used.

Additionally, examples of the dye include dyes that become anions by ionization, such as a zinc complex of tetra(4-sulfophenyl)porphyrin represented by the following chemical formula [Chem. 12], a free base of tetra(4-sulfophenyl)porphyrin, an indoline type organic dye having a carboxylic acid, a ruthenium complex having a carboxylic acid and having a bipyridine as a ligand, and a ruthenium complex having a carboxylic acid and having phenanthroline as a ligand.

[Chem. 12]

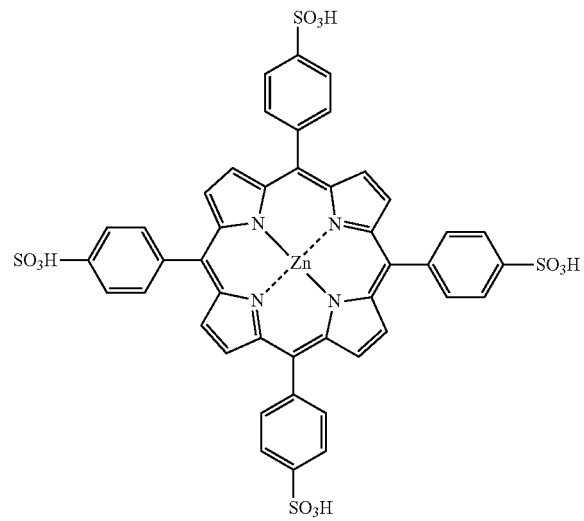

The dye preferably has an association on the electron transport layer 3, from the standpoint that the dye densely covers the electron transport layer 3 and thus serves as an insulator layer. When the photosensitizer serves as an insulator layer, the electron-rectifying property in the reactive interface is improved, and thus recombination of electrons and holes after charge separation is suppressed. Furthermore, recombination points of electrons and holes which are present in the electron transport material and the hole transport material, respectively, are drastically reduced, and thus the conversion efficiency of the photoelectric element 1 is further improved.

An example of the dye having an associating property is a dye represented by the following chemical formula [Chem. 13]. Specifically, a dye represented by the following chemical formula [Chem. 14] is preferred. The associating property is determined by comparing the shapes of optical absorption spectra of a dye dissolved in an organic solvent or the like and a dye supported by the electron transport layer 3. It is known that when a dye associates, the shape of an optical absorption spectrum of the dye is greatly changed.

[Chem. 13]

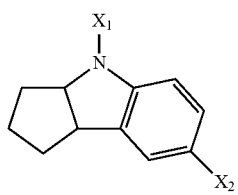

(Note that $X_1$ and $X_2$ each have at least one group selected from the group consisting of an alkyl group, an alkenyl group, an aralkyl group, an aryl group, and a heterocyclic ring, which may each have a substituent. $X_2$ has, for example, a carboxyl group, a sulfonyl group, or a phosphonyl group.)

[Chem. 14]

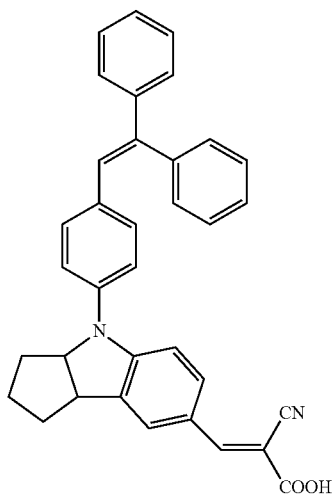

In addition, examples of the semiconductor ultrafine particle used as the photosensitizer include sulfide semiconductors such as cadmium sulfide, lead sulfide, and silver sulfide. Moreover, the particle diameter of the semiconductor ultrafine particle is not particularly limited as long as it is able to exert photosensitizing action on the electron transport layer 3. However, the particle diameter of the semiconductor ultrafine particle is preferably in a range of 1 to 10 nm.

The photosensitizer is supported by the electron transport layer 3 by an appropriate method. For example, a solution containing the photosensitizer infiltrates into the electron transport layer 3, whereby the photosensitizer is supported by the electron transport layer 3. Examples of the solvent of the solution include water, alcohol, toluene, and dimethylformamide, and the solvent of the solution is not particularly limited as long as it is able to dissolve or disperse the photosensitizer therein. Such a solution containing the photosensitizer is applied to the electron transport layer 3 by, for example, a spin coat method, whereby the solution infiltrates into the electron transport layer 3 and the photosensitizer is supported by the electron transport layer 3. Alternatively, the electron transport layer 3 may be immersed in the solution containing the photosensitizer, whereby the solution infiltrates into the electron transport layer 3 and the photosensitizer is supported by the electron transport layer 3.

The amount of the photosensitizer supported by the electron transport layer 3 is preferably in a range of $1\times10^{-10}$ to $1\times10^{-4}$ mol/cm$^2$ and particularly preferably in a range of $0.1\times10^{-8}$ to $9.0\times10^{-6}$ mol/cm$^2$, with respect to the area in planar view of the electron transport layer 3. When the amount is in this range, an effect of improving the photoelectric conversion efficiency is economically and sufficiently exerted.

The photosensitizer and the organic compound forming the electron transport layer 3 may be chemically bonded to each other. When the photosensitizer and the organic compound are chemically bonded to each other, it is thought that the average distance between them is decreased and electric charges easily transfer between them. In addition, it is expected that charge transfer transition occurs by the electron retaining states of them interacting with each other, that is, electron transfer from the photosensitizer to the organic compound occurs with photoexcitation on the photosensitizer by photoirradiation.

For example, when the organic compound is produced from the precursor by the electrolytic polymerization, the precursor and the photosensitizer are simultaneously electrolytically polymerized, whereby the organic compound and the photosensitizer can be chemically bonded to each other. In this case, the photosensitizer and the organic compound are simultaneously deposited, and chemical bonds between the photosensitizer and the organic compound are formed. Thus, a charge separation interface, namely, a reactive interface between the organic compound and the photosensitizer is formed at the molecular level. Therefore, the reactive area is increased, and the short-circuit current of the photoelectric element is increased. For the electrolytic polymerization of the precursor and the photosensitizer, for example, the photosensitizer is further contained in the solution containing the precursor when the organic compound is synthesized by the electrolytic polymerization method.

For the chemical bonding between the organic compound and the photosensitizer, the organic compound may be deposited on the surface of the first electrode by electrolytic polymerization, and then the photosensitizer may react with the organic compound. By so doing, the photosensitizer is preferentially bonded to the polymer ends of the organic compound, and a layer of the photosensitizer is formed on the surface of the organic compound at the molecular level. By the photosensitizer layer, a reverse electron reaction between the hole transport material and the electron transport layer 3 is suppressed, and thus the generated voltage of the photoelectric element 1 is increased. For the reaction of the organic compound and the photosensitizer, for example, the organic compound on the surface of the first electrode is immersed in a solution containing the photosensitizer. By so doing, the photosensitizer and the organic compound react with each other, and chemical bonds between the organic compound and the photosensitizer are formed. For the reaction of the photosensitizer and the organic compound, the photosensitizer and the organic compound may be electrolytically polymerized.

In order that chemical bonds are formed between the organic compound and the photosensitizer, the photosensitizer preferably has at least one leaving group within one molecule thereof. The molecule of the photosensitizer has reactivity with the organic compound or the precursor, and the leaving group is a functional group that departs from the molecule of the photosensitizer at the time of a reaction, and is preferably an electrolytic-polymerizable functional group. When the molecule of the photosensitizer has such a leaving group, the substituent represented by M in the structural formula (1) and the leaving group of the photosensitizer react with each other by application of a voltage, and chemical bonds between the photosensitizer and the organic compound can be easily formed.

The leaving group is preferably one or more groups selected from the group consisting of a cyano group, a fluoro group, a chloro group, and a bromo group. In this case, the reactivity of the leaving group is high, and the leaving group easily departs from the molecule of the photosensitizer during electrolytic polymerization. Thus, chemical bonds between the photosensitizer and the organic compound particularly are easily formed by the electrolytic polymerization.

When the molecule of the photosensitizer has the leaving group, the molecule of the photosensitizer preferably has a substituent represented by the following structural formula C or D. In the structural formulas C and D, R represents a leaving group. In the structural formulas C and D, n represents the number of substituents represented by the structural formula C or D within one molecule of the photosensitizer, and the number is preferably in a range of 1 to 4 as shown in the following formulas.

[Chem. 15]

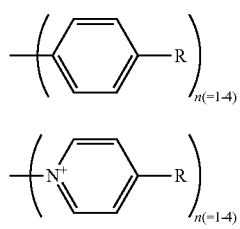

When the molecule of the photosensitizer has such a substituent, the reactivity between the leaving group of the photosensitizer and the substituent represented by M in the structural formula (1) during electrolytic polymerization is particularly increased, and chemical bonds between the photosensitizer and the organic compound can be formed by the rapid reaction.

The photosensitizer having the leaving group is particularly preferably at least one material selected from the group consisting of a porphyrin derivative represented by the following general formula E; an indoline type dye having, within a molecule thereof, an indoline backbone represented by the following formula F; and a ruthenium complex type dye represented by the following general formula G. R represents the leaving group. These photosensitizers easily cause electron exchange with the organic compound, and thus a higher charge injection efficiency is realized.

[Chem. 16]

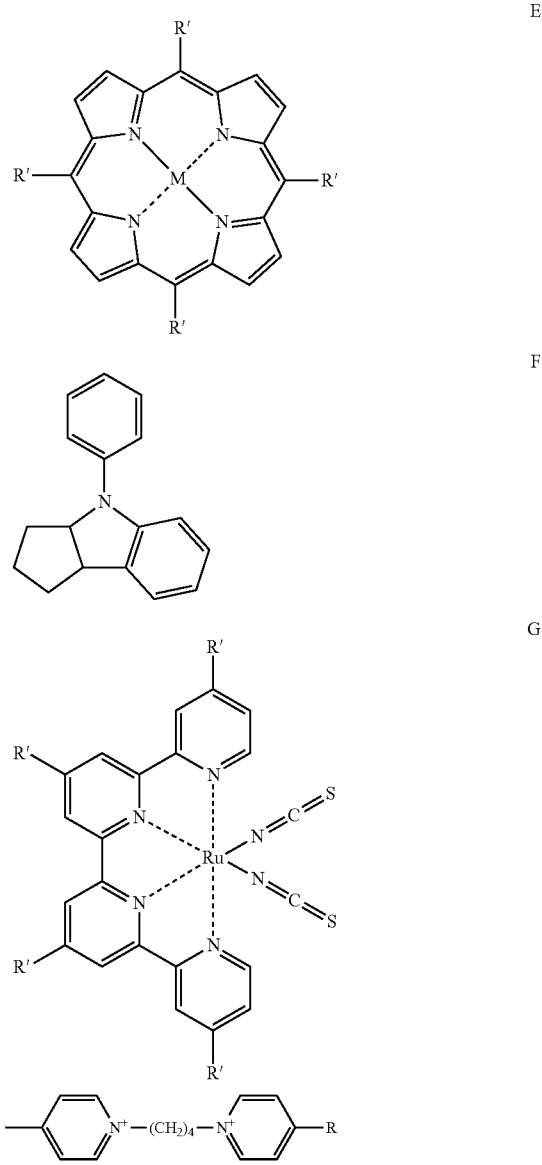

Specific examples of the indoline type dye having an indoline backbone and a leaving group include compounds represented by the following [Chem. 17] and [Chem. 18].

[Chem. 17]
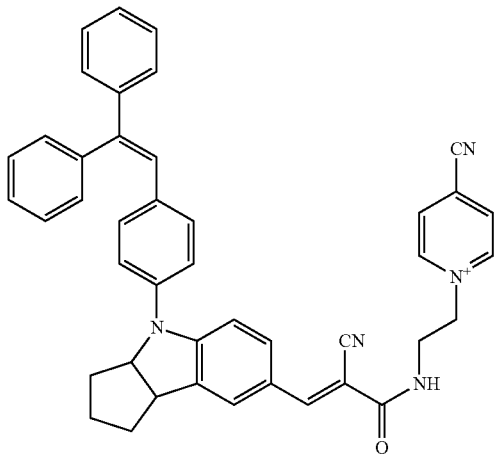
[Chem. 18]
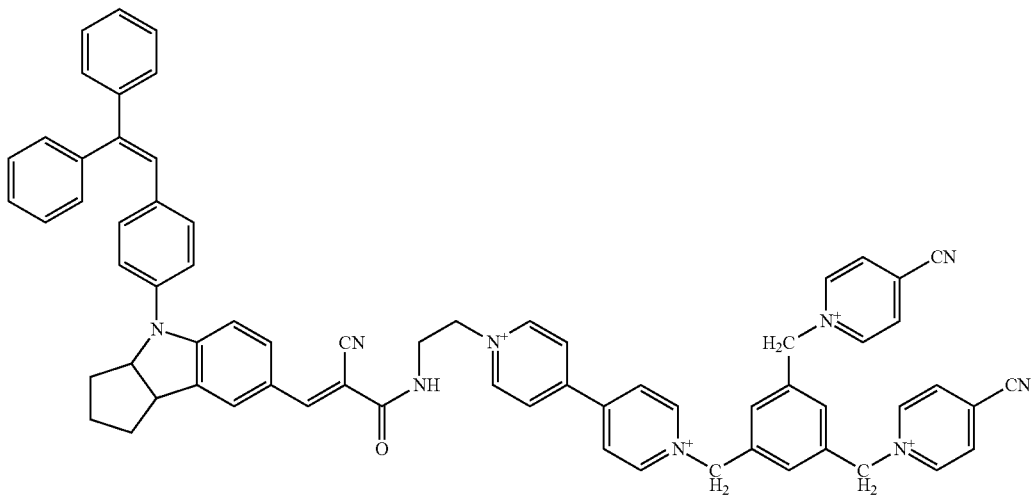
One example of a synthesis scheme for the compound represented by [Chem. 17] is represented by the following [Chem. 19].
[Chem. 19]
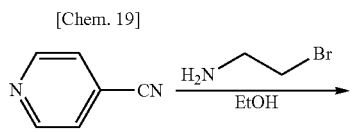
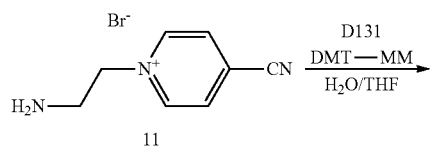
11
-continued
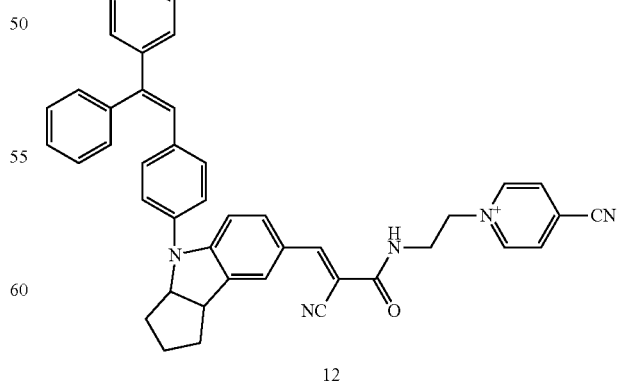
12
In the synthesis scheme, 4-cyanopyridine and bromoethylamine bromate react with each other in a solvent such as ethanol by boiling-point reflux or the like, and an intermediate represented by 11 in the synthesis scheme is precipitated. The reaction time is, for example, 24 hours. The intermediate is filtrated, then dissolved in a water/ethanol mixed solvent or the like, and further recrystallized. By so doing, yellow transparent plate-shaped crystals of the intermediate are obtained. Subsequently, the intermediate and the dye represented by [Chem. 14] (D131, manufactured by Mitsubishi Paper Mills Ltd.) react with each other in a water/THF mixed solvent in the presence of a condensing agent such as DMT-MM (4-(4, 6-dimethoxy-1,3,5-triazin-2-yl)-4-methylmorpholinium Chloride n-Hydrate), whereby dark orange crystal powder of a photosensitizer represented by 12 in the synthesis scheme is produced.

One example of a synthesis scheme for the compound represented by [Chem. 18] is represented by the following [Chem. 20].

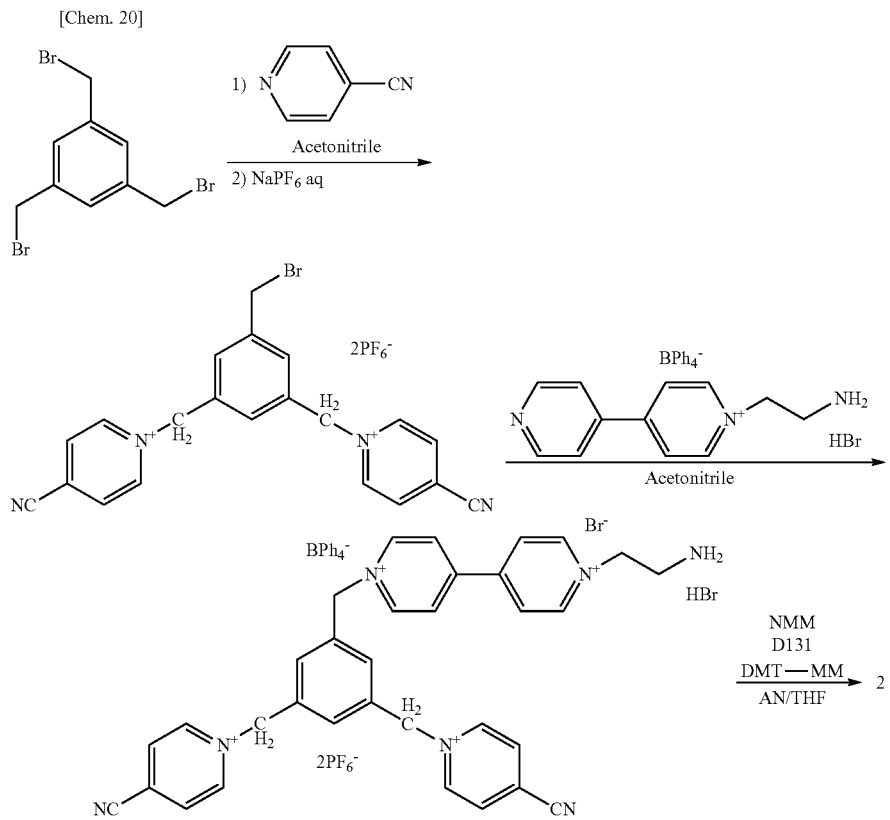

In the synthesis scheme, first, 1,3,5-trisbromomethylbenzene, which is a starting material, and a 2 equivalent amount of 4-cyanopyridine are added into a solvent such as acetonitrile, and the mixture obtained thus reacts by, for example, boiling-point reflux overnight, to obtain a pale yellow precipitate. The pale yellow precipitate is washed with acetonitrile and further filtrated, and then ion exchange is conducted thereon with $PF_6^-$ using a sodium hexafluorophosphate saturated aqueous solution, to obtain a white solid of a first intermediate represented by 3 in the synthesis scheme. The first intermediate and an aminoethyl bipyridinium salt ($BPh_4^-$, monosubstitution) are added into acetonitrile, and the mixture obtained thus reacts by, for example, boiling-point reflux overnight, to obtain an orange solid of a second intermediate represented by 4 in the synthesis scheme. Subsequently, the second intermediate and the dye represented by the chemical formula [Chem. 14] (D131, manufactured by Mitsubishi Paper Mills Ltd.) react with each other in an acetonitrile/THF mixed solvent in the presence of a condensing agent such as DMT-MM (4-(4,6-dimethoxy-1,3,5-triazin-2-yl)-4-methyl-morpholinium chloride-hydrate), and the reaction product is precipitated in ether, to obtain a photosensitizer represented by 2 in the synthesis scheme (the compound represented by [Chem. 18]).

The hole transport layer 4 is formed of an electrolyte solution. Examples of the electrolyte in the electrolyte solution include supporting salts and redox system constituents including an oxidant and a reductant, and the electrolyte may be either or both of them.

Examples of the supporting salts (supporting electrolytes) include ammonium salts such as tetrabutylammonium perchlorate, tetraethylammonium hexafluorophosphate, imidazolium salts, and pyridinium salts, and alkali metal salts such as lithium perchlorate and potassium tetrafluorborate.

The redox system constituents mean substances that are present reversibly in the forms of an oxidant and a reductant by redox reactions. Examples of the redox system constituents include a solution obtained by dissolving a redox pair in a solvent, solid electrolytes such as molten salts, p-type semiconductors such as copper iodide, amine derivatives such as triphenylamine, conductive polymers such as polyacetylene, polyaniline, and polythiophene.

Specific examples of the redox system constituents include, but are not limited to, a chlorine compound-chlorine, an iodine compound-iodine, a bromine compound-bromine, thallium ion (III)-thallium ion (I), mercury ion (II)-mercury ion (I), ruthenium ion (III)-ruthenium ion (II), copper ion (II)-copper ion (I), iron ion (III)-iron ion (II), nickel ion (II)-nickel ion (III), vanadium ion (III)-vanadium ion (II), and manganate ion-permanganate ion. In this case, these redox system constituents are distinguished from the redox moiety within the electron transport layer 3, and function.

The hole transport layer 4 may be formed of an electrolyte solution containing an electrolyte and a solvent. The solvent is preferably a compound that dissolves the redox system constituent therein and has excellent ion conductivity. An aqueous solvent or an organic solvent may be used as the solvent, but, for further stabilizing the constituents, an organic solvent is preferred as the solvent. Examples of the solvent include carbonate compounds such as dimethyl carbonate, diethyl carbonate, methylethyl carbonate, ethylene carbonate, and propylene carbonate, ester compounds such as methyl acetate, methyl propionate, and γ-butyrolactone, ether compounds such as diethylether, 1,2-dimethoxy ethane, 1,3-dioxosilane, tetrahydrofuran, and 2-methyl-tetrahydrofuran, heterocyclic compounds such as 3-methyl-2-oxazolidinone, and 2-methylpyrrolidone, nitrile compounds such as acetonitrile, methoxy acetonitrile, and propionitrile, and aprotic polar compounds such as sulfolane, dimethylsulfoxide, and dimethylformamide. These solvents may be used singly, or at least two or more of these solvents may be mixed and used together. Among them, carbonate compounds such as ethylene carbonate and propylene carbonate, γ-butyrolactone, heterocyclic compounds such as 3-methyl-2-oxazolidinone and 2-methylpyrrolidone, and nitrile compounds such as acetonitrile, methoxy acetonitrile, propionitrile, 3-methoxy propionitrile, and valeronitrile are preferred.

The hole transport layer 4 may contain an ionic liquid. In this case, the non-volatility, the fire retardancy, and the like of the hole transport layer 4 are improved. Although examples of the ionic liquid include all of well-known ionic liquids, examples of the ionic liquid include imidazolium type ionic liquids, pyridine type ionic liquids, alicyclic amine type ionic liquids, aliphatic amine type ionic liquids, azonium amine type ionic liquids, and ionic liquids with structures disclosed in the description of European Patent Publication No. 718288; WO95/18456; Denki Kagaku (1997) Vol. 65, No. 11, page 923; J. Electrochem. Soc. (1993) Vol. 143, No. 10, page 3099; and Inorg. Chem. (1996) Vol. 35, page 1168.

In addition, the electrolyte solution may be gelatinized or immobilized. The hole transport layer 4 may be formed of an electrolyte which is gelatinized (a gelatinized electrolyte) or a polymeric electrolyte. Examples of a gelatinizer for gelatinizing the electrolyte include polymers, gelatinizers utilizing a technique such as a polymer crosslinking reaction, polymerizable polyfunctional monomers, and oil gelatinizers. A material which is generally used may be used as the gelatinized electrolyte or the polymeric electrolyte, and preferable examples thereof include vinylidene fluoride type polymers such as polyvinylidene fluoride, acrylic acid type polymers such as polyacrylic acid, acrylonitrile type polymers such as polyacrylonitrile, polyether type polymers such as polyethylene oxide, and compounds having amide structures within structures.

The hole transport layer 4 may contain a stable radical compound. In this case, holes in the hole transport layer 4 are efficiently transported to the second electrode 5 by a very fast electron transfer reaction of the stable radical compound. Thus, the conversion efficiency of the photoelectric element 1 is further improved.

The stable radical compound is not particularly limited as long as it is a chemical species having an unpaired electron, namely, a compound having a radical. Specifically, the above-described compounds may be used.

In the photoelectric element 1 configured as described above, the electron transport layer 3 has an excellent electron transport property, and the reactive interface is wide since the organic compound and the electrolyte solution in the electron transport layer 3 constitute the gel layer 6. Thus, the photoelectric element 1 exerts a high photoelectric conversion efficiency.

That is, when light is applied to the photoelectric element 1 and reaches the electron transport layer 3, the photosensitizer is excited by absorbing the light, causing charge separation. The excited electrons flow into the electron transport layer 3 and are extracted to the outside through the first electrode 24. In the hole transport layer 4, holes are transported toward the second electrode 5. At that time, since the organic compound and the electrolyte solution in the electron transport layer 3 constitute the gel layer 6, the reactive interface where charge separation occurs is widened. In addition, since the electron transport layer 3 has an excellent electron transport property, recombination of electrons and holes is suppressed. Thus, the photoelectric conversion efficiency of the photoelectric element 1 is improved.

EXAMPLES

Next, the present invention will be specifically described by way of examples.

Example 1

Preparation of Precursor 4-cyanopyridine and 1,3,5-(bromomethyl)-mesitylene were dissolved in acetonitrile, and reflux was conducted in an inert atmosphere overnight, to proceed a reaction represented by the following reaction formula. After the end of the reaction, the product was purified by recrystallization with methanol, to obtain a precursor represented by the following chemical formula (J-1).

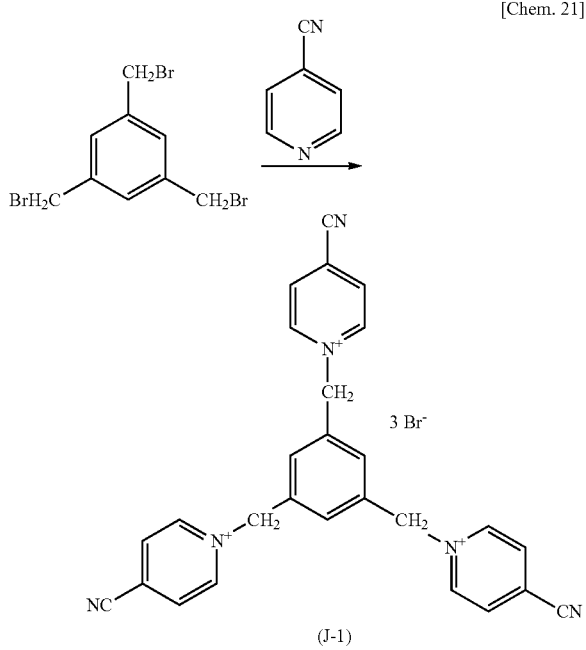

[Chem. 21]

(J-1)

(Production of Element)

A conductive glass substrate (manufactured by ASAHI GLASS CO., LTD., 10Ω/□) with a thickness of 1 mm having a fluorine-doped tin oxide film was prepared. The fluorine-doped tin oxide film was used as the first electrode 2.

An aqueous solution was prepared by adding a polyviologen precursor and sodium iodide to water such that the concentration of the polyviologen precursor was 0.02 M and the concentration of sodium iodide was 0.1 M. The first electrode 2 was immersed in this aqueous solution, and electrolytic polymerization was conducted with the electrode potential of the first electrode 2 being set at −0.75 V (vs. Ag/AgCl), to deposit an organic compound on the first electrode 2. The organic compound was immersed in an aqueous solution having a 4-cyano-1-methyl-pyridinium salt concentration of 0.02 M and a NaCl concentration of 0.1 M, to modify the ends of the organic compound. By so doing, the electron transport layer 3 was formed.

A response current was measured by cyclic voltammetry with the first electrode 2, on which the electron transport layer 3 was provided, as a working electrode, a platinum wire electrode as a counter electrode, and a silver/silver chloride electrode as a reference electrode, using a potassium chloride aqueous solution as a supporting electrolyte solution.

As a result, a stable and reversible redox wave originating from the organic compound in the electron transport layer 3 was observed when the electrode potential of the first electrode 2 with respect to the reference electrode was around 0 V, and it was confirmed that the organic compound in the electron transport layer 3 operates as an n-type semiconductor. In addition, the amount of electrons in the electrode reaction in a reduction process was substantially equal to a theoretical amount calculated from the number of radical sites (calculated from the amount of the organic compound attached on the first electrode 2), and thus a quantitative reaction of the organic compound was confirmed. Moreover, even when the measurement by cyclic voltammetry was repeated in 40 cycles, a stable redox wave was observed, and a stable operation as an electrode was confirmed.

A saturated acetonitrile solution of the dye represented by the above chemical formula [Chem. 14] (D131, manufactured by Mitsubishi Paper Mills Ltd.) was applied onto the electron transport layer 3 by a spin coat method, to cause the dye to be supported by the electron transport layer 3.

A conductive glass substrate (manufactured by ASAHI GLASS CO., LTD., 10Ω/□) with a thickness of 1 mm having a fluorine-doped tin oxide film was prepared, and platinum was deposited on the fluorine-doped tin oxide film by a sputtering method. By so doing, the second electrode 5 made of the fluorine-doped tin oxide film and platinum was formed. A hole for electrolyte solution injection was made in the conductive glass substrate with a diamond drill.

The electron transport layer 3 and the second electrode 5 were arranged so as to face each other, and a hot-melt adhesive (Bynel, manufactured by E. I. du Pont de Nemours and Company) was interposed therebetween at an outer edge portion so as to have a width of 1 mm and a thickness of 50 µm. The hot-melt adhesive was pressed while being heated, whereby the electron transport layer 3 and the second electrode 5 were joined to each other via the hot-melt adhesive.

An electrolyte solution was prepared by dissolving OH-TEMPO (4-hydroxy-2,2,6,6-tetramethylpiperidine-1-oxyl) and potassium chloride in water such that the concentration of OH-TEMPO was 0.5 M and the concentration of potassium chloride was 0.5 mol/l. This electrolyte solution was injected between the electron transport layer 3 and the second electrode 5 through the hole for electrolyte solution injection. By so doing, the hole transport layer 4 made of the electrolyte solution was formed between the electron transport layer 3 and the second electrode 5, and a portion of the electrolyte solution was infiltrated into the organic compound in the electron transport layer 3 to form the gel layer 6. Subsequently, the hole for electrolyte solution injection was sealed with an ultraviolet curing resin. In this manner, the photoelectric element 1 was obtained.

When light of 200 lux was applied to the photoelectric element 1 by using a fluorescent lamp ("FLR20S W/M", manufactured by Panasonic Corporation), an open-circuit voltage (OCP) was 566 mV. When the light to the photoelectric element 1 was blocked, the open-circuit voltage gradually converged to 0 mV. When the light was applied to the photoelectric element 1 again, the open-circuit voltage became 566 mV. This behavior was repeatedly and stably exhibited.

In addition, when a short-circuit current was measured under application of light of 200 lux with a fluorescent lamp ("FLR20S W/M", manufactured by Panasonic Corporation), a photocurrent of about 2.3 µA/cm$^2$ was observed. When the light was blocked, the photocurrent gradually converged to 0 A/cm$^2$. Furthermore, when the light was applied again, a photocurrent of about 2.3 µA/cm$^2$ was observed, and the photocurrent was generated stably and repeatedly (in 40 cycles).

Examples 2 to 6

The type of the dye and the type of the electrolyte in the electrolyte solution in Example 1 were changed as shown in Table 1. In Table 1, D102 denotes a dye manufactured by Mitsubishi Paper Mills Ltd. and represented by the following chemical formula [Chem. 22], and D358 denotes a dye manufactured by Mitsubishi Paper Mills Ltd. and represented by the following chemical formula [Chem. 23]. "I" denotes iodine. In this case, NaI (sodium iodide) was added into the electrolyte solution. The photoelectric element 1 was obtained under the same conditions as those in Example 1 except the above.

[Chem. 22]

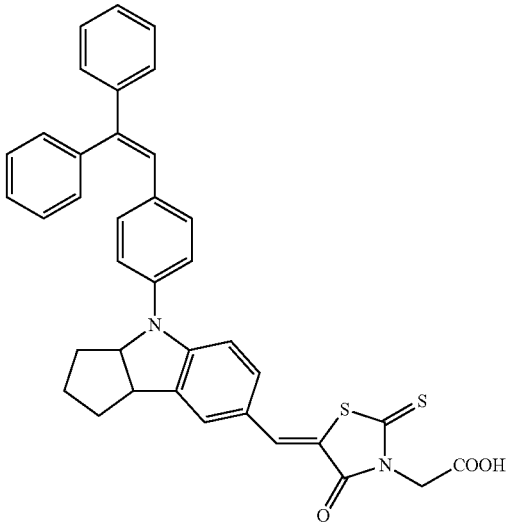

-continued

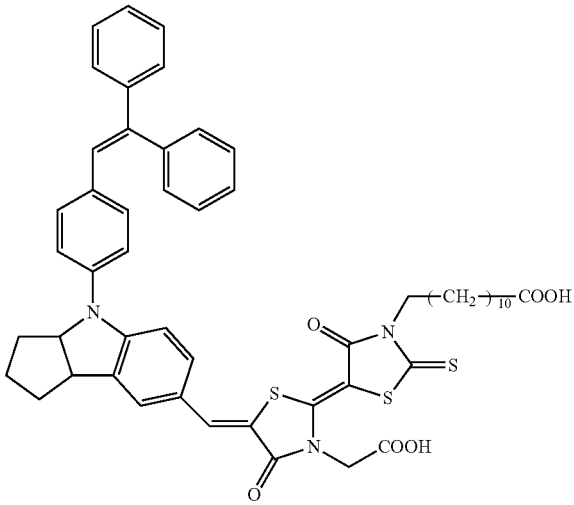

Example 7

A solution was prepared by dissolving 10.4 g (0.1 mol) of 4-cyanopyridine and 4.3 g (0.02 mol) of dibromobutane in 100 ml of acetonitrile. Boiling-point reflux was conducted on this solution at 82° C. in an inert atmosphere for 12 hours, to proceed a reaction represented by the following reaction formula [Chem. 24]. A pale yellow precipitate obtained thus was washed with acetonitrile, then sequentially filtered off and purified by recrystallization with water and methanol, to obtain yellow plate-shaped crystals of a precursor represented by the following chemical formula (J-2), at a yield of 60%.

The precursor was identified by 1H-NMR, 13C-NMR, MS, and elementary analysis. The results are as follows.

1H-NMR (D20), δ (ppm): 2.06 (t, CH2, 4H), 4.68 (t, CH2, 4H), 8.36 (d, —H of pyridium CH, 4H), 9.04 (d, —H of pyridium CH, 4H). 13C-NMR (D20), δ (ppm): 27.3, 61.9, 114.2, 128.5, 131.5, 146.0. MS: m/z=264.14 [M-2Br-]+2, calcd for C16H16Br2N4, 424.0, Elem. Anal. (%) Calcd for C16H16Br2N4: C, 45.31; H, 3.80; N, 13.21. Found C, 45.81; H, 3.97; N, 13.82.

[Chem. 24]

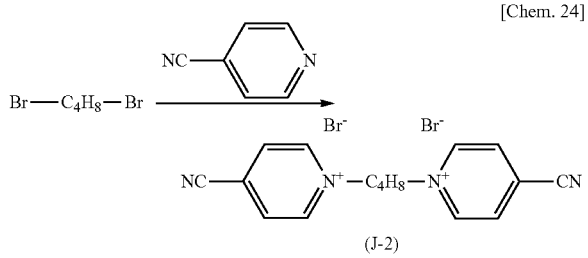

The photoelectric element 1 was obtained by the same method as that in Example 1, except that the precursor obtained thus was used and I (iodine) was used as the electrolyte in the electrolyte solution instead of OH-TEMPO. It should be noted that the electrode potential of the first electrode 2 during electrolytic polymerization was set to –0.91 V (vs. Ag/AgCl).

With respect to the photoelectric element 1, an open-circuit voltage and a short-circuit current were measured in the same manner as that in Example 1.

Example 8

A solution was prepared by dissolving 10.4 g (0.1 mol) of 4-cyanopyridine and 5.2 g (0.02 mol) of p-dibromoxylene in 100 ml of acetonitrile. Boiling-point reflux was conducted on this solution at 82° C. in an inert atmosphere for 12 hours, to advance a reaction represented by the following reaction formula [Chem. 25]. A pale yellow precipitate obtained thus was washed with acetonitrile, then sequentially filtered off and purified by recrystallization with water and methanol, to obtain pale yellow needle-shaped crystals of a precursor represented by the following chemical formula (J-3), at a yield of 70%.

The precursor was identified by 1H-NMR, 13C-NMR, MS, and elementary analysis. The results are as follows.

1H-NMR (D20), δ (ppm): 5.92 (t, phenyl CH, 4H), 7.54 (t, CH2, 4H), 8.43 (d, —H of pyridium CH, 4H), 9.14 (d, —H of pyridium CH, 4H). 13C-NMR (D20), δ (ppm): 66.1, 115.2, 129.7, 131.6, 132.6, 134.7, 147.0. MS: m/z=312.14 [M-2Br-]+2, calcd for C20H16Br2N4, 471.97. Elem. Anal. (%) Calcd for C20H16Br2N4: C, 50.87; H, 3.42; N, 11.87. Found C, 51.02; H, 3.56; N, 11.97.

[Chem. 25]

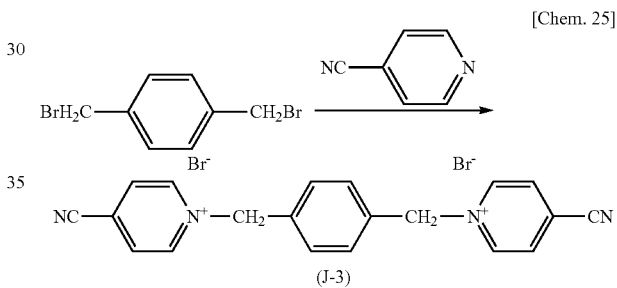

The photoelectric element 1 was obtained by the same method as that in Example 1, except that the precursor obtained thus was used and I (iodine) was used as the electrolyte in the electrolyte solution instead of OH-TEMPO. It should be noted that the electrode potential of the first electrode 2 during electrolytic polymerization was set to –0.84 V (vs. Ag/AgCl).

With respect to the photoelectric element 1, an open-circuit voltage and a short-circuit current were measured in the same manner as that in Example 1.

Example 9

In Example 1, after the electron transport layer 3 was formed on the first electrode 2, the following treatment was conducted instead of spin coating with the dye. First, the dye represented by [Chem. 17] and KCl were dissolved in a water/acetonitrile mixed solvent (a mass ratio of 1:1) such that the concentration of the dye was 10 mM and the concentration of KCl was 0.1 M. The first electrode 2 and the electron transport layer 3 were immersed in the solution obtained thus. In this state, with the first electrode 2 as a working electrode, a Pt electrode as a counter electrode, and an Ag/AgCl electrode as a reference electrode, a voltage was applied between the working electrode and the counter electrode such that the electrode potential of the working electrode was –0.85 V (vs. Ag/AgCl). By so doing, the photosensitizer was supported by the electron transport layer 3. The photoelectric element 1 was obtained by the same method as that in Example 1 except the above.

With respect to the photoelectric element 1, an open-circuit voltage and a short-circuit current were measured in the same manner as that in Example 1.

Example 10

In Example 1, in forming the electron transport layer 3, first, a polyviologen precursor, sodium iodide, and the dye represented by [Chem. 17] were added into a water/acetonitrile mixed solvent (a mass ratio of 1:1) such that the concentration of the polyviologen precursor was 0.02 M, the concentration of sodium iodide was 0.1 M, and the concentration of the dye was 0.02 M. The first electrode 2 was immersed in the solution obtained thus, and electrolytic polymerization was conducted with the electrode potential of the first electrode 2 being set to −0.75 V (vs. Ag/AgCl), to deposit an organic compound on the first electrode 2. The organic compound was immersed in an aqueous solution having a 4-cyano-1-methyl-pyridinium salt concentration of 0.02 M and a NaCl concentration of 0.1 M, to modify the ends of the organic compound. By so doing, the electron transport layer 3 was formed. The photoelectric element 1 was obtained by the same method as that in Example 1 except the above.

With respect to the photoelectric element 1, an open-circuit voltage and a short-circuit current were measured in the same manner as that in Example 1.

Examples 11 and 12

The type of the dye and the type of the electrolyte in the electrolyte solution in Example 1 were changed as shown in Table 1. In Table 1, [Chem. 18] denotes the dye represented by the above chemical formula [Chem. 18]. The dye represented by the chemical formula [Chem. 18] was synthesized according to the synthesis scheme represented by the above [Chem. 20]. The photoelectric element 1 was obtained under the same conditions as those in Example 1 except the above.

With respect to the photoelectric element 1, an open-circuit voltage and a short-circuit current were measured in the same manner as that in Example 1.

Comparative Example 1

The polyviologen precursor represented by chemical formula J-1 was obtained by the same method as that in Example 1. A solution was prepared by dissolving the polyviologen precursor in methanol. This solution was applied onto the first electrode 2 by a spin coat method. However, a uniform film was not formed of the solution.

When measurement was conducted by the same cyclic voltammetry as that in Example 1, stable redox did not repeatedly proceed.

Comparative Example 2

Synthesis of Galvi Monomer

First, 4-bromo-2,6-di-tert-butylphenol (135.8 g; 0.476 mol) and acetonitrile (270 ml) were added, and N,O-bis(trimethylsilyl)acetamide (BSA) (106.3 g; 129.6 ml) was further added in an inert atmosphere. By stirring at 70° C. overnight, the reaction was allowed to proceed until crystals were completely deposited. The white crystals deposited thus were filtrated, dried in vacuum, and then purified by recrystallization with ethanol, to obtain white plate-shaped crystals of (4-bromo-2,6-di-tert-butylphenoxy)trimethylsilane (150.0 g; 0.420 mol).

Next, (4-bromo-2,6-di-tert-butylphenoxy)trimethylsilane (9.83 g; 0.0275 mol) was dissolved in tetrahydrofuran (200 ml) within a reaction vessel in an inert atmosphere. The prepared solution was cooled to −78° C. by using dry ice and methanol. A 1.58 M n-butyllithium/hexane solution (15.8 ml; 0.025 mol) was added into this solution within the reaction vessel, and lithiation was conducted by stirring at 78° C. for 30 minutes. Then, a tetrahydrofuran solution (75 ml) of methyl 4-bromobenzoate (1.08 g; 0.005 mol, Mw; 215.0, TCI) was added into this solution, and then stirred at −78° C. to room temperature overnight. By so doing, the solution changed in color from yellow through pale yellow to dark blue indicating formation of anion. Next, a saturated ammonium chloride aqueous solution was added into the solution within the reaction vessel until the solution completely changed in color to yellow. Then, extraction was conducted on this solution with ether and water, to obtain a yellow viscous liquid product.

Next, the above product, THF (10 ml), methanol (7.5 ml), and a stirrer were put into a reaction vessel. After dissolving, 10N-HCl (1 to 2 ml) was added gradually until the color of the solution within the reaction vessel changed to red orange, and stirred at room temperature for 30 minutes. Then, purification was conducted through each of operations of solvent removal, extraction with ether and water, solvent removal, fractionation by column chromatography (hexane/chloroform=1/1), and recrystallization with hexane, to obtain orange crystals of (p-bromophenyl)hydrogalvinoxyl (2.86 g; 0.0049 mol).

Next, the (p-bromophenyl)hydrogalvinoxyl (2.50 g; 4.33 mmol) was dissolved in toluene (21.6 ml; 0.2 M) within a reaction vessel in an inert atmosphere, and 2,6-di-tert-buthyl-p-cresol (4.76 mg; 0.0216 mmol), tetrakis(triphenylphosphine)palladium(0) (0.150 g; 0.130 mmol), and tri-n-butyl (vinyl)tin (1.65 g; 5.20 mmol, Mw: 317.1, TCI) were quickly added into this solution and heated and stirred at 100° C. for 17 hours.

The reaction product obtained thus was extracted with ether and water, and the solvent was removed therefrom. Then, the reaction product was fractionated by flash column chromatography (hexane/chloroform=1/3) and purified further by recrystallization with hexane, to obtain orange microcrystals of p-hydrogalvinoxyl styrene (1.54 g; 2.93 mmol).

(Polymerization of Galvi Monomer)

1 g of the galvi monomer (p-hydrogalvinoxyl styrene) obtained in the above synthesis of the galvi monomer, 57.7 mg of teraethylene glycol diacrylate, and 15.1 mg of azobisisobutyronitrile were dissolved in 2 ml of tetrahydrofuran. Then, the galvi monomer was polymerized by purging with nitrogen and reflux overnight, to obtain a galvi polymer. The number average molecular weight of the galvi polymer was 10000.

(Production of Element)

A conductive glass substrate (manufactured by ASAHI GLASS CO., LTD., 10Ω/□) with a thickness of 1 mm having a fluorine-doped tin oxide film was prepared. The fluorine-doped tin oxide film was used as the first electrode 2. A solution was prepared by dissolving 22.5 mg of the galvi polymer in 4.5 ml of chloroform. This solution was drop-cast onto the first electrode 2 to foam a film with a thickness of 100 nm. Then, the first electrode 2 was immersed in an acetonitrile solution having a tetrabutylammonium perchlorate concentration of 0.1 M and a lithium-t-butoxy (Aldrich: CAS1907-33-1) concentration of 0.01 M. In this state, with the first electrode 2 as a working electrode, a Pt electrode as a counter electrode, an Ag/AgCl electrode as a reference electrode, a voltage was applied between the working electrode and the counter electrode such that the electrode potential of the working electrode was within a range of 1 V to 1.5 V (vs. Ag/AgCl). By so doing, the galvi polymer was electrolytically oxidized into a radical, and the radical was polymerized, whereby the electron transport layer 3 made of the galvinoxy radical polymer was formed on the first electrode 2.

Next, an acetonitrile saturated solution of the D131 dye whose chemical structural formula is represented by [Chem. 14] was applied to the electron transport layer 3 by a spin coat method, to cause the dye to be supported by the electron transport layer 3.

The electron transport layer 3 was scraped at an outer peripheral portion of the first electrode 2, and a hot-melt adhesive ("Bynel", manufactured by E. I. du Pont de Nemours and Company) as a sealing material was disposed on the outer peripheral portion of the first electrode 2 so as to surround the electron transport layer 3.

A conductive glass substrate (manufactured by ASAHI GLASS CO., LTD., 10Ω/□) with a thickness of 1 mm having a fluorine-doped tin oxide film was prepared, and platinum was deposited on the fluorine-doped tin oxide film by a sputtering method. By so doing, the second electrode 5 made of the fluorine-doped tin oxide film and platinum was formed. A hole for electrolyte solution injection was made in the conductive glass substrate with a diamond drill.

The electron transport layer 3 and the second electrode 5 were arranged so as to face each other, and a hot-melt adhesive was interposed therebetween. The hot-melt adhesive was pressed while being heated, whereby the electron transport layer 3 and the second electrode 5 were joined to each other via the hot-melt adhesive.

A electrolyte solution was prepared by dissolving the D131 dye represented by the above [Chem. 14], 2,2,6,6-tetramethylpiperidine-1-oxyl (TEMPO), N-methylbenzimidazole, and lithium perchlorate in acetonitrile such that the concentration of the D131 dye was 5 mmol/l, the concentration of 2,2,6,6-tetramethylpiperidine-1-oxyl was 0.1 mol/l, the concentration of N-methylbenzimidazole was 1.6 mol/l, and the concentration of lithium perchlorate was 1 mol/l. This electrolyte solution was injected between the electron transport layer 3 and the second electrode 5 through the hole for electrolyte solution injection. By so doing, the hole transport layer 4 made of the electrolyte solution was formed between the electron transport layer 3 and the second electrode 5, and a portion of the electrolyte solution was infiltrated into the organic compound of the electron transport layer 3 to form the gel layer 6. Subsequently, the hole for electrolyte solution injection was sealed with an ultraviolet curing resin. In this manner, the photoelectric element 1 was obtained.

With respect to the photoelectric element 1, an open-circuit voltage and a short-circuit current were measured in the same manner as that in Example 1. At the measurement, when the short-circuit current was measured under application of light of 200 lux with a fluorescent lamp ("FLR20S W/M", manufactured by Panasonic Corporation), a photocurrent of about 0.5 $\mu A/cm^2$ was observed. When the light was blocked, the photocurrent gradually converged to 0 $A/cm^2$. Furthermore, when the light was applied again, a photocurrent of about 0.5 $\mu A/cm^2$ was observed, and the photocurrent was generated stably and repeatedly (in 40 cycles).

[Evaluation]

With regard to each example and each comparative example, the measurement results of the open-circuit voltage (Voc) and the short-circuit current (Jsc) of the photocurrent element are shown. With regard to each example and each comparative example, the maximum output (Pmax) of the photocurrent element is also shown.

TABLE 1

| Dye | Electrolyte solution additive | | Voc (mV) | Jsc ($\mu A/cm^2$) | Pmax ($\mu W/cm^2$) |
|---|---|---|---|---|---|
| Ex. 1 | D131 | Potassium chloride | OH-TEMPO | 566 | 2.34 | 0.37 |
| Ex. 2 | D131 | Potassium chloride | I | 186 | 10 | 0.66 |
| Ex. 3 | D102 | Potassium chloride | OH-TEMPO | 612 | 3.82 | 0.78 |
| Ex. 4 | D102 | Potassium chloride | I | 163 | 1.9 | 0.08 |
| Ex. 5 | D358 | Potassium chloride | OH-TEMPO | 336 | 0.94 | 0.07 |
| Ex. 6 | D358 | Potassium chloride | I | 166 | 5.26 | 0.34 |
| Ex. 7 | D131 | Potassium chloride | I | 170 | 16.44 | 1.46 |
| Ex. 8 | D131 | Potassium chloride | I | 190 | 3.7 | 0.35 |
| Ex. 9 | [Chem. 17] | Potassium chloride | OH-TEMPO | 602 | 4.37 | 0.51 |
| Ex. 10 | [Chem. 17] | Potassium chloride | OH-TEMPO | 453 | 6.32 | 0.78 |
| Ex. 11 | [Chem. 18] | Potassium sodium | OH-TEMPO | 652 | 4.17 | 0.31 |
| Ex. 12 | [Chem. 18] | Potassium sodium | I | 210 | 5.87 | 0.45 |
| Comp. Ex. 1 | — | — | — | — | — | — |
| Comp. Ex. 2 | D131 | Potassium chloride | OH-TEMPO | 500 | 0.5 | 0.03 |

As is apparent from the results, the short-circuit current values are higher in Examples 1 to 10 than in Comparative Example 2. Thus, it can be confirmed that the electron transport property in the electron transport layer 3 is favorable in Examples 1 to 10. In addition, thus, the maximum output of the photoelectric element 1 is also higher in Examples 1 to 10 than in Comparative Example 2, and it can be confirmed that the photoelectric conversion efficiency is high in Examples 1 to 10. In Examples 11 and 12 as well, the short-circuit current values are higher than in Comparative Example 2. Thus, it can be confirmed that the electron transport property in the electron transport layer 3 is favorable in Examples 11 and 12. In addition, thus, the maximum output of the photoelectric element 1 is also higher in Examples 11 and 12 than in Comparative Example 2, and it can be confirmed that the photoelectric conversion efficiency is high in Examples 11 and 12.

REFERENCE SIGNS LIST

1 photoelectric element
2 first electrode
3 electron transport layer
4 hole transport layer
5 second electrode
6 gel layer

The invention claimed is:
1. A photoelectric element comprising:
a first electrode;
an electron transport layer supporting a photosensitizer;
a hole transport layer;
a second electrode; and an electrolyte solution, wherein
the first electrode, the electron transport layer, the hole transport layer, and the second electrode are stacked in order,
the electron transport layer is formed of an organic compound produced by electrolytic polymerization of a precursor having, within one molecule thereof, two or more moieties each having a structure represented by the following structural formula (1),
the organic compound is a polymer,
the photosensitizer is bonded to the polymer end of the organic compound, and
the organic compound and the electrolyte solution infiltrated into the organic compound constitute a gel layer:

[Chem. 1]

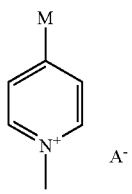

(1)

(in the structural formula (1), M is a cyano group, a fluoro group, a chloro group, or a bromo group, and A⁻ is a counter-anion).

2. The photoelectric element according to claim 1, wherein
the precursor has, within one molecule thereof, two moieties each having the structure represented by the structural formula (1), and
the organic compound is a linear polymer.

3. The photoelectric element according to claim 1, wherein the organic compound includes at least one of a compound represented by the following structural formula (2) and a compound represented by the following structural formula (3):

[Chem. 2]

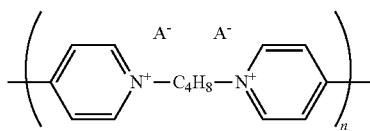

(2)

[Chem. 3]

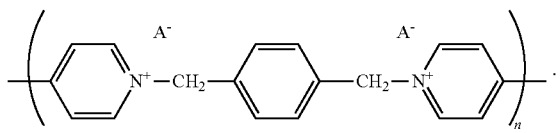

(3)

4. The photoelectric element according to claim 1, wherein
the precursor has, within one molecule thereof, three or more moieties each having the structure represented by the structural formula (1), and
the organic compound has a crosslinked structure.

5. The photoelectric element according to claim 1, wherein the organic compound includes a compound represented by the following structural formula (4):

[Chem. 4]

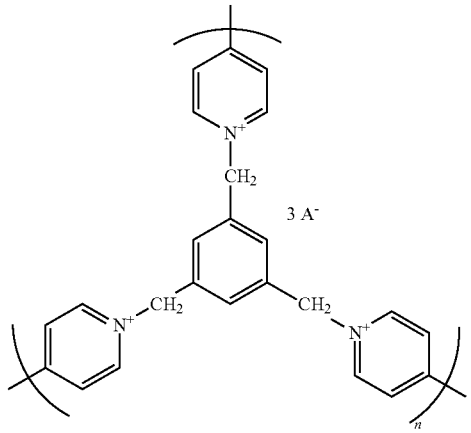

(4)

6. The photoelectric element according to claim 1, wherein the counter-anion in the precursor is an anion selected from the group consisting of a bromine ion, a chlorine ion, a perchlorate ion, a hexafluorophosphoric acid ion, and a tetrafluoroboric acid ion.

7. The photoelectric element according to claim 1, wherein the organic compound and the photosensitizer are chemically bonded to each other.

8. A process for producing the photoelectric element according to claim 1, the process comprising the step of:
conducting electrolytic polymerization by applying a current to the first electrode and a liquid containing the precursor in a state where the first electrode is immersed in the liquid, to deposit the organic compound on a surface of the first electrode.

9. The process for producing the photoelectric element according to claim 8, wherein
the photosensitizer is mixed in the liquid containing the precursor, and
the precursor and the photosensitizer are simultaneously electrolytically polymerized.

10. The process for producing the photoelectric element according to claim 8, wherein
after the step of depositing the organic compound on the surface of the first electrode, the organic compound is immersed in a liquid containing the photosensitizer to react the photosensitizer with the organic compound.

11. The photoelectric element according to claim 1, wherein the photosensitizer has at least one leaving group within one molecule thereof.

12. The photoelectric element according to claim 1, wherein the photosensitizer has a substituent represented by the following structural formula C or D:

[Chem. 5]

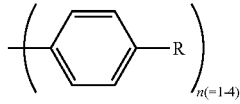

C

-continued

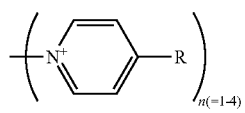
D wherein R in the structural formulas C and D represents a leaving group.

13. The photoelectric element according to claim 1, wherein the photosensitizer is a porphyrin derivative represented by the following general formula E, an indoline type dye having, within a molecule thereof, an indoline backbone represented by the following formula F, or a ruthenium complex type dye represented by the following general formula G:

[Chem. 6]

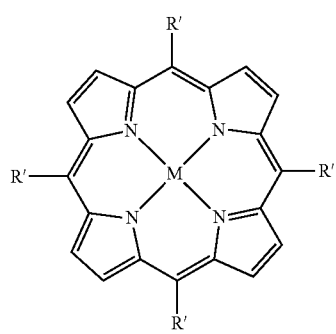
E

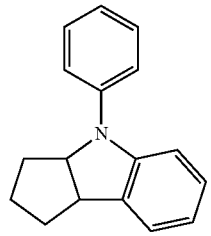
F

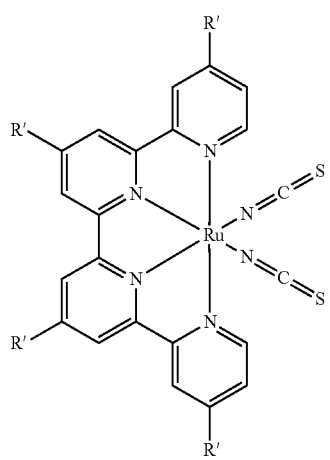
G wherein R represents a leaving group.

14. The photoelectric element according to claim 1, wherein the leaving group is one or more groups selected from the group consisting of a cyano group, a fluoro group, a chloro group, and a bromo group.

15. A photoelectric element comprising:
a first electrode;
an electron transport layer supporting a photosensitizer;
a hole transport layer;
a second electrode; and
an electrolyte solution, wherein
the first electrode, the electron transport layer, the hole transport layer, and the second electrode are stacked in order,
the electron transport layer is formed of an organic compound produced by electrolytic polymerization of a precursor having, within one molecule thereof, two or more moieties each having a structure represented by the following structural formula (1),
the organic compound and the electrolyte solution infiltrated into the organic compound constitute a gel layer, and
the organic compound includes at least one compound selected from the group consisting of a compound represented by the following structural formula (2), a compound represented by the following structural formula (3), and a compound represented by the following structural formula (4):

[Chem. 7]

(1)

(in the structural formula (1), M is a cyano group, a fluoro group, a chloro group, or a bromo group, and A⁻ is a counteranion),

[Chem. 8]

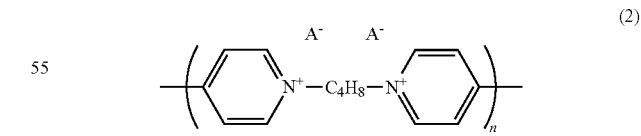
(2)

[Chem. 9]

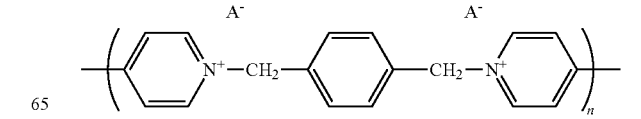
(3)

[Chem. 10]
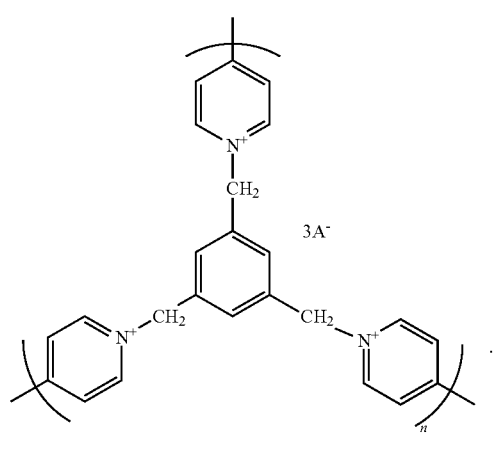
(4)
* * * * *